United States Patent
Han et al.

(10) Patent No.: US 7,968,438 B2
(45) Date of Patent: Jun. 28, 2011

(54) ULTRA-THIN HIGH-QUALITY GERMANIUM ON SILICON BY LOW-TEMPERATURE EPITAXY AND INSULATOR-CAPPED ANNEALING

(75) Inventors: Sang M. Han, Albuquerque, NM (US); Qiming Li, Albuquerque, NM (US)

(73) Assignee: STC.UNM, Albuquerque, NM (US)

( * ) Notice: Subject to any disclaimer, the term of this patent is extended or adjusted under 35 U.S.C. 154(b) by 320 days.

(21) Appl. No.: 11/835,855

(22) Filed: Aug. 8, 2007

(65) Prior Publication Data

US 2008/0146008 A1 Jun. 19, 2008

Related U.S. Application Data

(60) Provisional application No. 60/836,183, filed on Aug. 8, 2006.

(51) Int. Cl.
*H01L 21/20* (2006.01)
*H01L 21/36* (2006.01)
(52) U.S. Cl. ............ 438/509; 257/E21.09; 257/E21.129
(58) Field of Classification Search ............ 438/478
See application file for complete search history.

(56) References Cited

U.S. PATENT DOCUMENTS

| | | | | |
|---|---|---|---|---|
| 5,256,550 A * | 10/1993 | Laderman et al. | ............ | 438/509 |
| 5,610,085 A * | 3/1997 | Yuan et al. | ............ | 438/187 |
| 7,042,052 B2 * | 5/2006 | Bhattacharyya | ............ | 257/347 |
| 2004/0241459 A1 * | 12/2004 | Bedell et al. | ............ | 428/446 |

* cited by examiner

*Primary Examiner* — Matthew C Landau
*Assistant Examiner* — Sonya D McCall Shepard
(74) *Attorney, Agent, or Firm* — MH2 Technology Law Group LLP (57) ABSTRACT

Exemplary embodiments provide semiconductor devices with a high-quality semiconductor material on a lattice mismatched substrate and methods for their manufacturing using low temperature growth techniques followed by an insulator-capped annealing process. The semiconductor material can have high-quality with a sufficiently low threading dislocation (TD) density, and can be effectively used for integrated circuit applications such as an integration of optically-active materials (e.g., Group III-V materials) with silicon circuitry. In an exemplary embodiment, the high-quality semiconductor material can include one or more ultra-thin high-quality semiconductor epitaxial layers/films/materials having a desired thickness on the lattice mismatched substrate. Each ultra-thin high-quality semiconductor epitaxial layer can be formed by capping a low-temperature grown initial ultra-thin semiconductor material, annealing the capped initial ultra-thin semiconductor material, and removing the capping layer.

25 Claims, 5 Drawing Sheets

ULTRA-THIN HIGH-QUALITY GERMANIUM ON SILICON BY LOW-TEMPERATURE EPITAXY AND INSULATOR-CAPPED ANNEALING

RELATED APPLICATIONS

This application claims priority from U.S. Provisional Patent Application Ser. No. 60/836,183, filed Aug. 8, 2006, which is hereby incorporated by reference in its entirety.

GOVERNMENT RIGHTS

This invention was made with Government support under Contract No. DMR-0094145 awarded by the National Science Foundation, and Contract No. W911 NF-05-1-0012 awarded by the Army Research Office. The U.S. Government has certain rights in this invention.

FIELD OF THE INVENTION

This invention relates generally to semiconductor devices and fabrication processes and, more particularly, relates to epitaxial growth of lattice mismatched systems.

BACKGROUND OF THE INVENTION

The fabrication of the next generation of advanced, multi-functional semiconductor devices that interlace optoelectronic, telecommunication, and conventional complementary metal oxide semiconductor (CMOS) components requires growth of lattice-mismatched systems. Lattice mismatched systems can provide a wide range of materials characteristics. For example, the mechanical stress in a lattice mismatched layer and control of its crystal symmetry can be used to modify the energy-band structure to optimize performance of optoelectronic devices. Lattice mismatched systems can also enable compound semiconductor devices to be integrated directly with silicon (Si) circuitry (e.g., Si-based CMOS circuitry).

For the integration of compound semiconductor epilayers on Si, problems arise due to the lattice mismatch between the epilayer and the underlying Si, and this mismatch is often exacerbated by their thermal expansion coefficient mismatch. The performance of integrated devices has been largely limited by the resulting crystalline defects from epitaxy (e.g., a high density of dislocations).

Thus, there is a need to overcome these and other problems of the prior art and to provide techniques for growing high-quality epitaxial layers of lattice mismatched systems.

SUMMARY OF THE INVENTION

According to various embodiments, the present teachings include a method for forming a semiconductor layer. The semiconductor layer can be formed by growing an initial ultra-thin semiconductor material that has a thickness of about 80 nm or less on a lattice mismatched substrate at a low temperature. A capping layer can then be formed on the initial ultra-thin semiconductor material followed by an annealing process to form a capped ultra-thin high-quality semiconductor epilayer. An ultra-thin high-quality semiconductor epilayer on the substrate can then be exposed by removing the capping layer.

According to various embodiments, the present teachings also include a method for forming a semiconductor layer. In this method, an initial ultra-thin germanium film can be grown on a silicon substrate at a low temperature, wherein the crystallinity of the initial ultra-thin germanium film can be about 30% or less. An insulator capping layer can then be formed on the initial ultra-thin germanium film followed by an annealing process of the insulator-capped initial ultra-thin germanium film to form an insulator-capped ultra-thin high-quality germanium epilayer. The insulator capping layer can then be removed to expose an ultra-thin high-quality germanium epilayer on the silicon substrate.

According to various embodiments, the present teachings further include a method for forming a semiconductor device. In the method, a silicon substrate can be provided, and one or more ultra-thin high-quality germanium epilayers can be formed thereon. Each of the one or more ultra-thin high-quality germanium epilayers can be formed by, firstly, capping a low-temperature grown initial ultra-thin germanium film by forming an insulator layer thereon, secondly, annealing the capped initial ultra-thin germanium film to form a capped ultra-thin high-quality germanium epilayer, and thirdly, removing the insulator layer. A Group III-V material can then be formed on the one or more ultra-thin high-quality germanium epilayers on the silicon substrate.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate several embodiments of the invention and together with the description, serve to explain the principles of the invention.

DESCRIPTION OF THE EMBODIMENTS

Reference will now be made in detail to the present embodiments (exemplary embodiments) of the invention, examples of which are illustrated in the accompanying drawings. Wherever possible, the same reference numbers will be used throughout the drawings to refer to the same or like parts. In the following description, reference is made to the accompanying drawings that form a part thereof, and in which is shown by way of illustration specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, merely exemplary.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising." The term "at least one of" is used to mean one or more of the listed items can be selected.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

Exemplary embodiments provide semiconductor devices with a high-quality semiconductor material on a lattice mismatched substrate and methods for their manufacturing using low temperature growth techniques followed by an insulator-capped annealing process. The semiconductor material can have high-quality, i.e., with a sufficiently low threading dislocation (TD) density, and can be effectively used for integrated circuit applications. For example, the disclosed high-quality semiconductor material can be used as a high-quality interlayer for integrating optically-active materials (e.g., Group III-V materials) with silicon circuitry. In an exemplary embodiment, the high-quality semiconductor material can include one or more ultra-thin high-quality semiconductor epitaxial layers/films/materials having a desired thickness on the lattice mismatched substrate. Each ultra-thin high-quality semiconductor epitaxial layer/film/material can be formed by capping a low-temperature grown initial ultra-thin semiconductor material, annealing the capped initial ultra-thin semiconductor material, and removing the capping layer.

The term "ultra-thin" as used herein refers to a thickness of a semiconductor layer, for example, about 80 nm or less. In an exemplary embodiment, one ultra-thin semiconductor epilayer can be about 20 nm thick. The term "high-quality" as used herein refers to a low threading dislocation (TD) density of semiconductor layer(s)/film(s)/material(s). The low TD density can be, for example, on the order of about $2 \times 10^4$ cm$^{-2}$ or lower, which can be calculated based on dilute Schimmel solution etch pit density measurement known to one of ordinary skill in the art. In an exemplary embodiment, the TD density of high-quality semiconductor layer(s) can be about $10^4$ cm$^{-2}$ or lower.

In various embodiments, the substrate can include any semiconductor material having a lattice-mismatch to a desired epitaxial layer. The terms "lattice-mismatch" and "lattice-mismatched materials" as used herein refer to any two materials whose lattice parameters in a given crystalline plane or direction are not identical. Lattice-mismatched materials can include, but are not limited to, silicon and germanium, silicon and carbon, silicon and gallium arsenide (GaAs), silicon and indium phosphide (InP), and silicon and gallium nitride (GaN).

For ease of illustration, the invention will be described with reference to a manufacturing process for formation of an epitaxial material of germanium (Ge) on a silicon (Si) substrate. For example, an initial ultra-thin Ge material can be formed on a Si substrate at a low temperature (i.e., lower than the temperature used in the art for an ordinary Ge epitaxial growth to form a 100% single crystalline film). The initial ultra-thin Ge material can then be capped with an insulator layer, for example, $Si_3N_4$, followed by an annealing process, for example, a thermal annealing or a scanning laser annealing, to provide a capped ultra-thin high-quality Ge epilayer. Following the annealing process, the insulator layer can be removed exposing an ultra-thin high-quality Ge epilayer on the Si substrate.

In various embodiments, a second semiconductor material, including at least one element chosen from Group II, Group III, Group IV, Group V, and Group VI, can be formed on the formed ultra-thin high-quality Ge epitaxial layer/film. For example, a second initial ultra-thin Ge material can be formed at a low-temperature on an ultra-thin high-quality Ge epilayer and annealed with insulator capping, followed by removing the insulator capping after annealing. In this manner, a number of ultra-thin high-quality Ge epilayers can be formed on the silicon substrate until a desired thickness of Ge is obtained.

Figure 1:
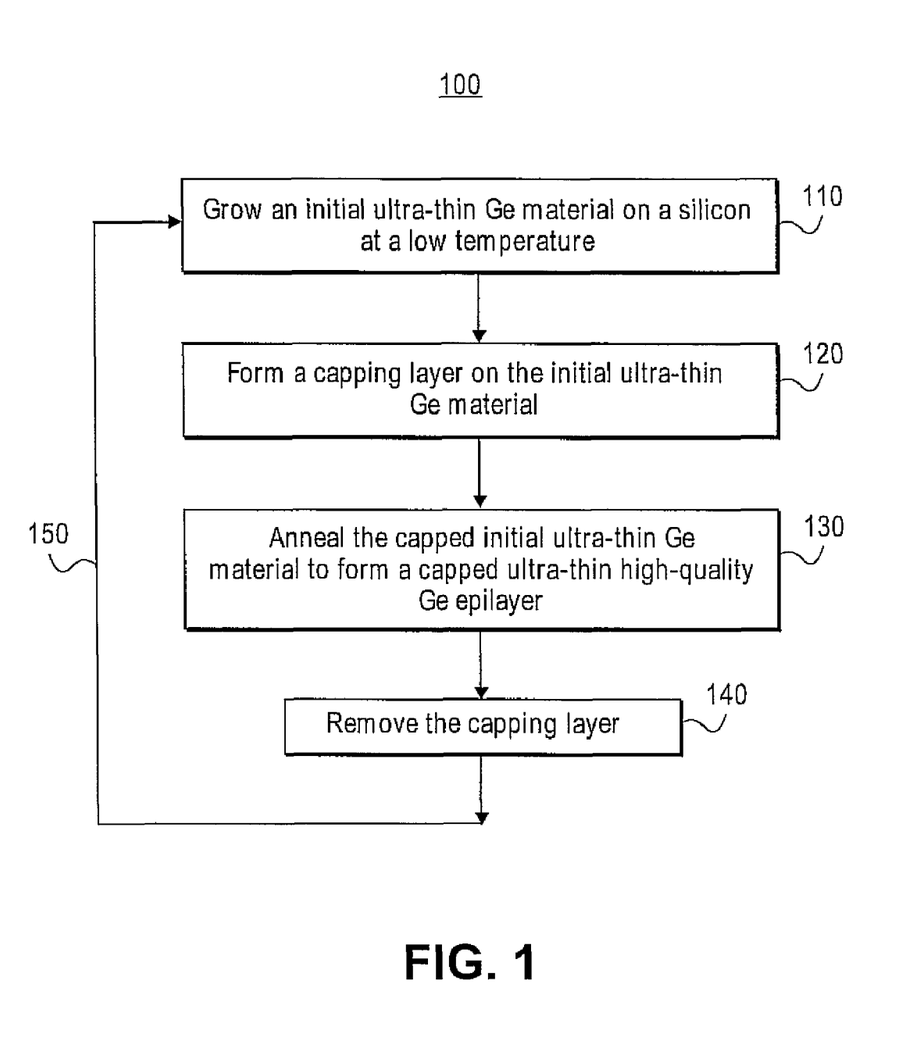
FIG. 1 depicts an exemplary method for forming high-quality epilayers on a lattice mismatched substrate in accordance with the present teachings.

FIG. 1 depicts an exemplary method 100 for forming high-quality germanium on the lattice mismatched silicon in accordance with the present teachings. As shown, at 110, an initial ultra-thin, partially crystalline (<30%) Ge material can be grown on a Si substrate. The Si substrate can be, for example, an offcut Si (100). In an exemplary embodiment, the offcut Si (100) can be used to prevent antiphase domains for an exemplary Group III-V material growth such as a GaAs growth.

The initial growth of the ultra-thin Ge material can be performed at a low temperature of, for example, about 350° C. or lower, using various crystal growth (i.e., epitaxy) mechanisms including, but not limited to, molecular-beam epitaxy (MBE), gas source MBE (GSMBE), metal-organic MBE (MOMBE), metal-organic chemical vapor deposition (MOCVD), atomic layer epitaxy (ALE), hydride vapor phase epitaxy (HVPE), or organometallic vapor phase epitaxy (OMVPE). For example, an initial ultra-thin Ge material can be grown on an oxide-free Si (100) at a low temperature of about 200° C. in an ultra-high vacuum MBE chamber. In various embodiments, the initial ultra-thin Ge material can have limited crystalline domains with a large amount fraction of amorphous domains. For example, the initial ultra-thin Ge material can have a crystallinity of about 30% or less, with reference to a crystallinity of about 100% for a resulting ultra-thin high-quality Ge epitaxial material formed using the disclosed methods.

It is discovered that this low-temperature growth can form threading dislocations with Burgers vector on {111}, without producing vertically propagated threading dislocations (i.e., 90° from the substrate surface) having Burgers vector on (001). As disclosed, the TDs formed on {111} can glide along <110> directions of the ultra-thin Ge material during the subsequent annealing process and thus be reduced significantly. In addition, the low temperature growth can also lead to a smooth material surface, which eliminates the need for a polishing process, for example, a chemical mechanical planarization (CMP), which was usually used for preparing a surface for subsequent film growth as known to one of ordinary skill in the art.

It is believed, without being limited to any particular theory, that a low percentage of crystalline seeds in the initial film, preferably at the Ge—Si interface, in combination with having an ultra-thin layer, can enable the Ge seeds at the Ge—Si interface quickly grow out to reach the capping layer and grow laterally to coalesce. That is, it is desirable to have Ge seeds pre-formed during the initial film growth as opposed to random Ge crystalline domains in the Ge bulk away from the Ge—Si interface, which can lead to a polycrystalline film. Furthermore, having an ultrathin film avoids any formation of random Ge crystalline domains in the Ge bulk away from the Ge—Si interface during annealing, which again can lead to a polycrystalline film. Even further, if the initial film is 100% amorphous, recrystallization requires very high temperatures near or above 900° C. and can be time consuming without leading to a single crystalline film.

At 120, following the epitaxial formation in the crystal reaction chamber, a capping layer can be formed on the initial ultra-thin Ge material on the silicon substrate. The capping layer can be formed to prevent the formation of hillocks, which can cause a pileup of threading dislocations during the subsequent annealing process by preventing the TDs from gliding. The capping layer can be an insulator layer. The capping layer can include a material chosen from, for example, silicon nitride, silicon oxide, silicon oxynitride, silicon carbide, silicon oxycarbide (SiOC), or any suitable dielectric materials. The capping layer can be formed using, for example, various chemical vapor deposition (CVD) techniques, such as, PECVD (plasma enhanced chemical vapor deposition), or HDPECVD (high-density plasma enhanced chemical vapor deposition). In various embodiments, the capping layer can have any arbitrary thickness, provided that the layer can be easily removed. In an exemplary embodiment, the capping layer can include a $Si_3N_4$ film deposited on the initial ultra-thin Ge material having a thickness of about 80 nm using PECVD process. In various embodiments, the insulator layer can be optically transparent.

At 130, the capped initial ultra-thin Ge material can then be annealed to force threading dislocations (that are generated during the low-temperature growth at 110 in FIG. 1) to glide along <110> directions in the Ge material, while leaving pure edge dislocations at the Ge—Si heterojunction/interface. In an exemplary embodiment, the capped initial ultra-thin Ge material can be thermally annealed at a temperature of about 850° C. or lower. For example, this post-growth annealing can be performed at about 670° C. to force the threading dislocations to glide as desired.

Figure 2A:
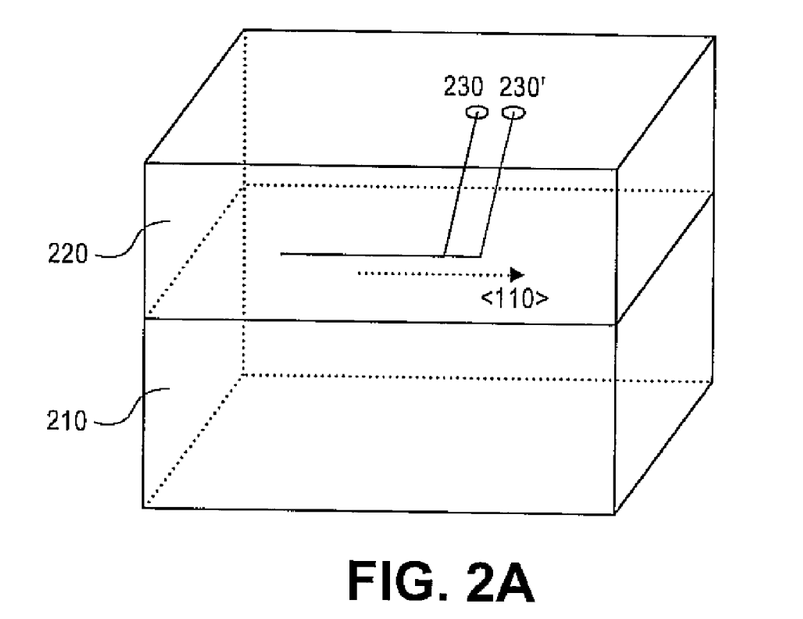
FIGS. 2A-2B are schematics showing gliding mechanics to reduce threading dislocations in accordance with the present teachings.
Figure 2B:
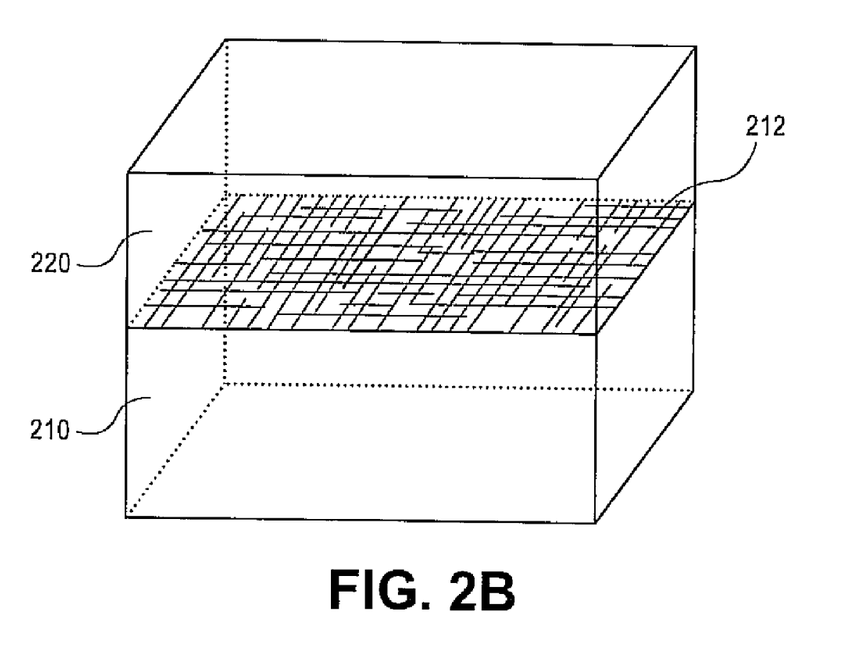

FIGS. 2A-2B are schematics showing gliding mechanics to reduce threading dislocations in the ultra-thin Ge material in accordance with the present teachings. As shown in FIGS. 2A-2B, an ultra-thin Ge material 220 can be formed on a silicon substrate 210 according to the exemplary method 100. During annealing, threading dislocations (TDs) (see the lines with an end circle in FIG. 2A) can glide along <110> directions from position 230 to position 230' in the ultra-thin Ge material 220. Pure edge dislocations 212 (see FIG. 2B) can then be formed at the Ge—Si heterojunction (i.e., the interface plane).

Figure 3A:
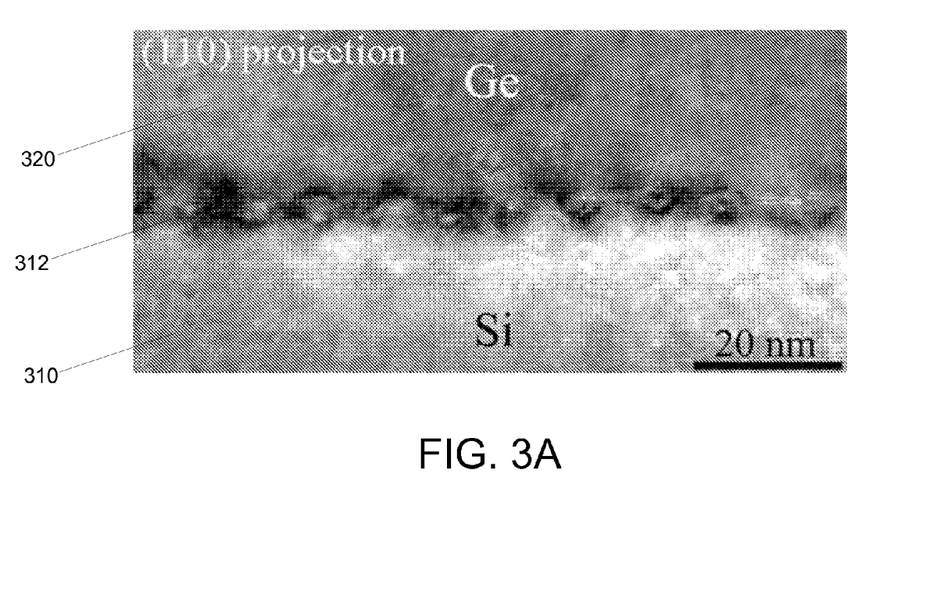
FIGS. 3A-3B depict an exemplary result of an ultra-thin Ge/Si stack in accordance with the present teachings.
Figure 3B:
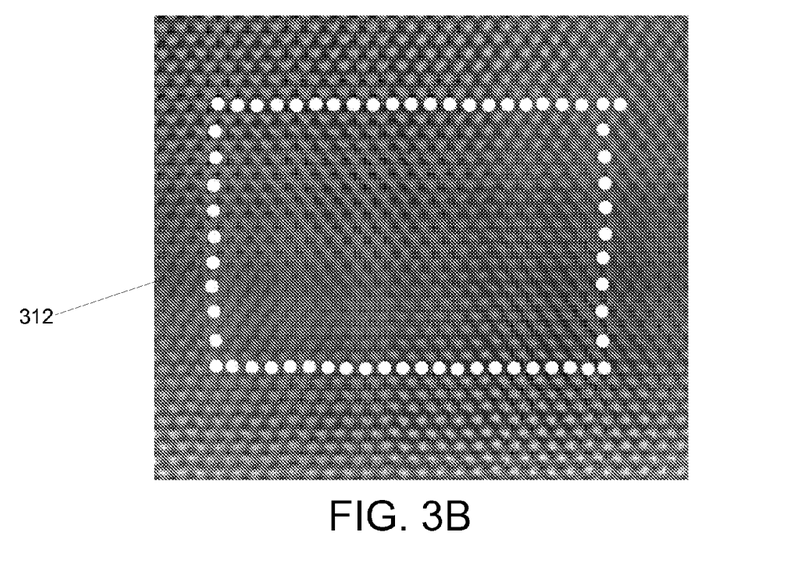

FIGS. 3A-3B further show an exemplary transmission electron microscope (TEM) result of the pure edge dislocations formed at the exemplary Ge—Si heterojunction in accordance with the present teachings. In particular, FIG. 3A shows an exemplary cross-sectional TEM image of the pure edge dislocations 312 (also see the schematic layer 212 in FIG. 2B) formed at the heterojunction of a Ge layer 320 and a silicon substrate 310. The Ge layer 320 can be formed on the silicon substrate 310 according to the method 100 as disclosed herein. FIG. 3B shows a close-up result of an exemplary localized pure edge dislocations 312 indicating a Burgers circuit that results in a <110> on (001) plane.

In various embodiments, the initial capped ultra-thin Ge material can be alternatively annealed using, for example, a scanning laser annealing. In this example, the scanning laser annealing can be performed in the visible range through, for example, a thin and optically transparent $Si_3N_4$ capping layer. During this laser annealing, the Ge—Si interface can be kept near room temperature, and thus minimizing Ge—Si interdiffusion.

In various embodiments, the resulting ultra-thin Ge epilayer on the silicon can provide high-quality having a low threading dislocation density of about $2\times10^{-4}$ cm$^{-2}$ or less. In addition, the insulator-capped annealing can provide the ultra-thin Ge epilayer an increased crystallinity and a smooth surface free of a polishing process.

Referring back to FIG. 1, at 140, following the insulator-capped anneal, the insulator capping layer can be removed using various etching methods and exposing an ultra-thin high-quality Ge epilayer. For example, a $Si_3N_4$ capping layer can be etched away from the ultra-thin high-quality Ge epilayer using a wet etch process such as a buffered HF solution, or a dry etch such as a plasma etch (e.g., reactive ion etch).

In various embodiments, a second semiconductor material can be formed on the ultra-thin high-quality semiconductor Ge epitaxial film/layer. The second semiconductor material can include, for example, at least one element chosen from Group II, Group III, Group IV, Group V, or Group VI.

For example, as shown at 150, a second ultra-thin high-quality Ge film can be formed on the (first) ultra-thin high-quality Ge epi-film that is described at 140. The second ultra-thin high-quality Ge film can be formed by repeating the method 100 including, for example, a low-temperature growing of a second initial ultra-thin Ge material, capping and annealing the second initial ultra-thin Ge material, and removing the capping layer after the annealing process. Likewise, a number of ultra-thin high-quality Ge epitaxial films/layers can be formed on the Si substrate until a desired (or arbitrary) thickness of the Ge epilayer is obtained according to specific device and/or application requirements. For example, an arbitrarily thick Ge epilayer can be grown on top of Si at a low temperature using metal organic chemical vapor deposition (MOCVD) to increase the overall throughput of the resulting device. That is, a high-quality Ge/Si stack can therefore be formed with a desired thickness of Ge epilayer on the Si substrate.

FIGS. 4A-4F depict an exemplary process flow for forming a semiconductor device 400 with high-quality Ge epilayer on a Si substrate in accordance with the present teachings. It should be readily apparent to one of ordinary skill in the art that the device 400 depicted in FIGS. 4A-4F represents a generalized schematic illustration and that other steps/layers can be added or existing steps/layers can be removed or modified.

Figure 4A:
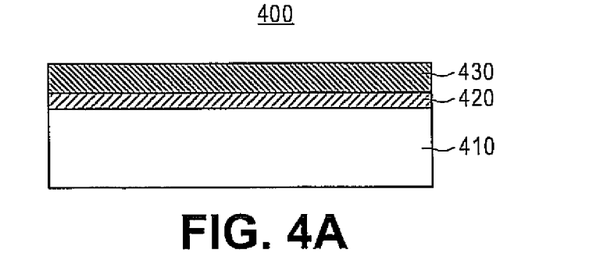
FIGS. 4A-4F depict an exemplary process flow for forming a semiconductor device having lattice mismatched systems in accordance with the present teachings.
Figure 4B:
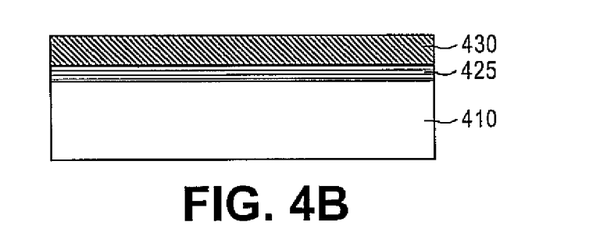
Figure 4C:
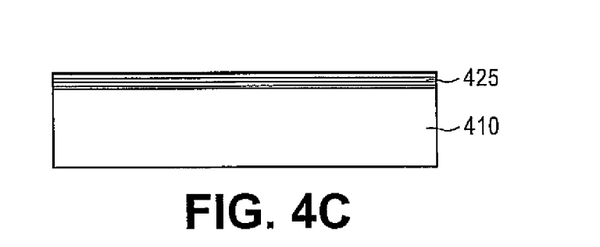
Figure 4D:
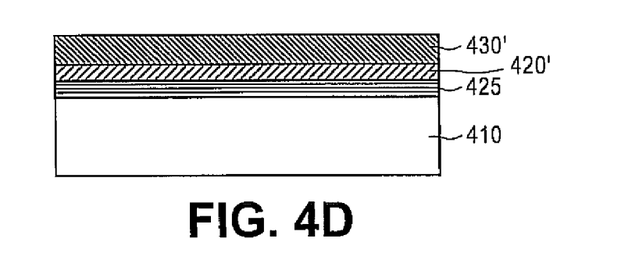
Figure 4E:
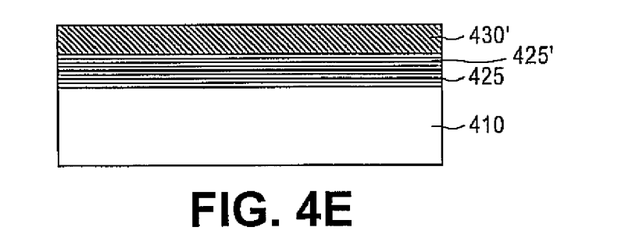
Figure 4F:
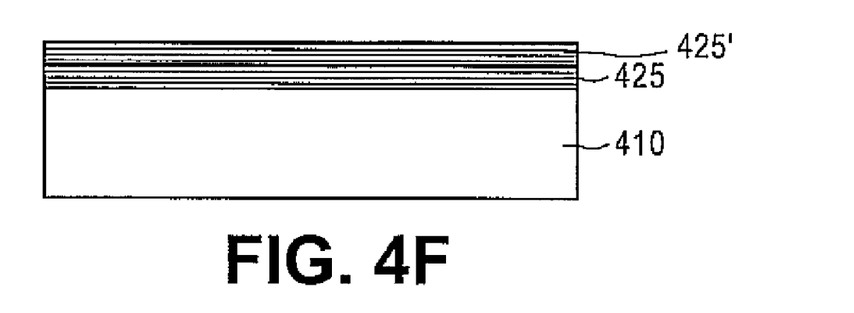

The device 400 can be formed generally according to the method 100 as described herein in connection with FIG. 1. Specifically, FIGS. 4A-4C depict a first ultra-thin high-quality Ge layer 425 formed on a silicon substrate 410 using a low-temperature epitaxial growth and insulator-capped annealing process. FIGS. 4D-4F depict a second ultra-thin high-quality Ge layer 425' formed on the first ultra-thin high-quality Ge layer 425 on the silicon substrate 410 using the low-temperature growth and insulator-capped annealing process. In various embodiments, a number of ultra-thin high-quality Ge layers can be stacked on the silicon substrate 410 to have a desired thickness of high-quality Ge on Si.

In FIG. 4A, an insulator capping layer 430 can be formed on a first initial ultra-thin Ge layer 420 that is formed on a silicon substrate 410. The first initial ultra-thin Ge layer 420 can be formed on the silicon substrate 410 at a low temperature to provide a polishing free surface and form TDs with Burgers vector on {111}, which can glide along <110> directions during the subsequent annealing to significantly reduce TDs. Following the low-temperature growth of the first ultra-thin Ge layer 420, the insulator capping layer 430 can be formed thereon including a material chosen from, for example, silicon oxide, silicon nitride or other dielectric materials.

In FIG. 4B, the capped initial ultra-thin Ge/Si stack (i.e., 430/420/410) can be annealed to reduce TD density in the first ultra-thin Ge layer 420. By capping the ultra-thin Ge/Si stack, formation of hillocks that cause threading dislocations to pileup during the subsequent post-growth annealing can be avoided. The anneal can be performed by, for example, a thermal anneal, or a scanning laser annealing in the visible range through, for example, a thin and optically transparent $Si_3N_4$ capping layer. The annealed first ultra-thin Ge layer 425 can be in high quality having a reduced TD density of about $2 \times 10^4$ cm$^{-2}$ or less. In an exemplary embodiment, the reduced TD density can be about $10^4$ cm$^{-2}$ or less.

In FIG. 4C, following the insulator-capped anneal, the insulator capping layer 430 can be removed using various etching techniques known in the art depending on the insulator material used. For example, a $Si_3N_4$ capping layer can be etched away from the annealed ultra-thin high-quality Ge layer 425 by a chemical wet etching in a buffered HF solution.

In FIG. 4D through FIG. 4F, the process flow described in FIGS. 4A-4C can be repeated to form a second ultra-thin high-quality Ge layer 425' on the first ultra-thin high-quality Ge layer 425 through a growth at low temperatures followed by a post-growth insulator-capped anneal and a removal of the insulator capping layer.

Specifically, in FIG. 4D, a second insulator capping layer 430' can be formed on a second initial ultra-thin Ge layer 420' that is formed on the first ultra-thin high-quality Ge layer 425. In FIG. 4E, the capped second initial ultra-thin Ge epilayer 420' can be annealed to form a second ultra-thin high-quality Ge layer 425'. In FIG. 4F, the second insulator capping layer 430' can then be removed from the second ultra-thin high-quality Ge layer 425'.

In various embodiments, a number of ultra-thin high-quality Ge layer, e.g., 425, 425', 425" (not shown), 425''' (not shown), etc., can be formed on the silicon substrate 410 using the method 100 and the process flow shown in FIGS. 4A-4F. Compound semiconductor materials, e.g., optically active materials chosen from Group III-V materials or group II-VI materials, can then be integrated on these high-quality Ge layers to alleviate the problem caused by large lattice mismatch and thermal expansion coefficient mismatch between these materials and Si.

Figure 5A:
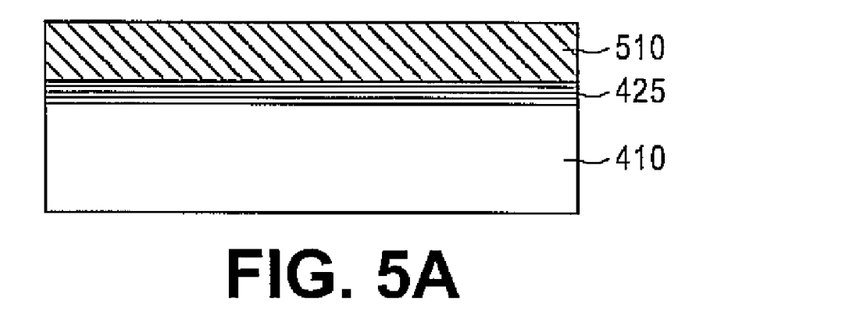
FIGS. 5A-5B depict an exemplary integrated semiconductor device in accordance with the present teachings.
Figure 5B:
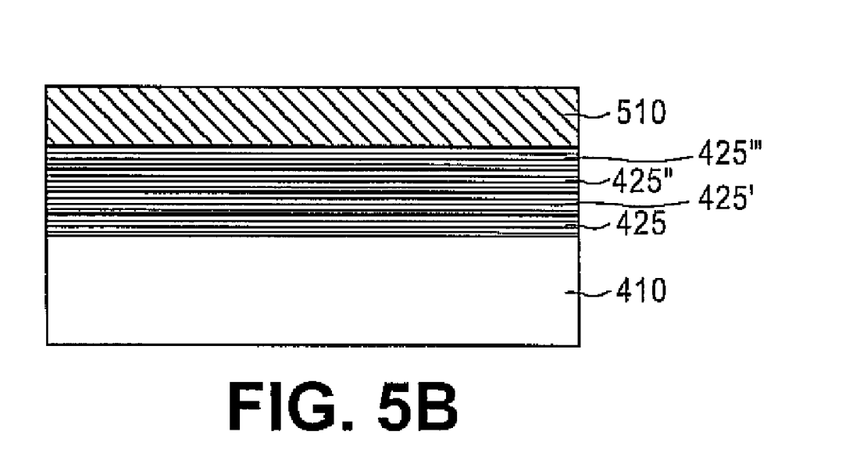

For example, FIGS. 5A-5B depict integrated semiconductor devices including a Group II-V material 510 formed on exemplary high-quality Ge/Si stacks (e.g., device 400) in accordance with the present teachings. As shown, in FIG. 5A, a Group III-V material 510, such as, a GaAs layer, can be formed on the device 400 shown in FIG. 4C having an ultra-thin high-quality Ge layer 425 on a silicon substrate 410. In FIG. 5B, the Group III-V material 510, such as, a GaAs layer, can be formed on a stack of the ultra-thin high-quality Ge layers, e.g., on a forth ultra-thin high-quality Ge layer 425'''. In an exemplary embodiment, a GaAs layer (e.g., 510) can be grown on a high-quality Ge epilayer (e.g., 425), which is formed on an offcut Si (001) that is about 2° to 8° tilted towards <110>. As a result, reflection high energy electron diffraction (RHEED) patterns (not shown) taken in situ during GaAs growth and photoluminescence (not shown) measured on the resulting GaAs strongly indicate that the GaAs layer can be a single-crystalline, high-quality epilayer.

In various embodiments, the interdiffusion length of Ge—Si heterojunction/interface of the high-quality Ge/Si stack (as shown in FIGS. 4A-4F and/or FIGS. 5A-5B), which depends on temperature and duration of the post-growth annealing process, can be critical for the integration of compound semiconductor materials (e.g., GaAs) on Si. Our simulations (see below) indicate that when the interdiffusion length of Ge—Si is short (e.g., shorter than the Ge epilayer thickness), the stress caused by the thermal expansion coefficient mismatch can be alleviated when the compound semiconductor layers (e.g., GaAs) are grown on top of the Ge/Si stack. For example, the GaAs layer can be formed on a graded $Si_{1-x}Ge_x$/Si stack forming a GaAs/graded $Si_{1-x}Ge_x$/Si stack, whose graded layer effectively constitutes a large interdiffused domain, and therefore a long Ge—Si interdiffusion length. In contrast, the GaAs layer can be formed on a pure 100% Ge on Si stack forming a GaAs/Ge/Si stack that has a short Ge—Si interdiffusion length. As simulated by a finite element method available through FEMLab® (a commercial software package), for the GaAs/graded $Si_{1-x}Ge_x$/Si stack, a large stress can be concentrated mostly near the interface between the GaAs layer and the top of the graded $Si_{1-x}Ge_x$ layer, whereas for the GaAs/Ge/Si stack, the stress can be distributed diffusely in the pure Ge layer. The thick pure Ge layer can therefore be more resilient to the thermal expansion mismatch as compared with the graded Ge layer because of a short Ge—Si interdiffusion length. In this simulation, the graded $Si_{1-x}Ge_x$ layer and the pure Ge layer can have same thickness, for example, about 4-μ-thick, and can be annealed by an exemplary thermal annealing at about 670° C. and cooled at room temperature. Furthermore, when the size (e.g., thickness) of Ge—Si heterojunctions is reduced to nanoscale, for example, about 7 nm or less, the film stress in Group III-V materials and the Ge films can be reduced.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for forming a semiconductor layer comprising:
    growing an initial ultra-thin semiconductor material on a lattice mismatched substrate at a low temperature, wherein the initial ultra-thin semiconductor material has a thickness of about 80 nm or less;
    forming an insulator capping layer on the initial ultra-thin semiconductor material;
    annealing the capped initial ultra-thin semiconductor material to induce dislocation gliding to form pure edge dislocations at a heterojunction between the lattice mismatched substrate and the initial ultra-thin semiconductor material, and to form a capped ultra-thin high-quality semiconductor epilayer; and
    removing the insulator capping layer to expose the high-quality semiconductor epilayer on the substrate.

2. The method of claim 1, wherein the initial ultra-thin semiconductor material is grown using a technique selected from the group consisting of molecular-beam epitaxy (MBE), and metal-organic chemical vapor deposition (MOCVD).

3. The method of claim 1, wherein the capping layer comprises a material selected from the group consisting of silicon nitride, silicon oxide, silicon oxynitride, silicon carbide, and silicon oxycarbide (SIOC).

4. The method of claim 1, wherein the capped initial ultra-thin semiconductor material is thermally annealed at a temperature of about 850° C. or lower.

5. The method of claim 1, wherein the capped initial ultra-thin semiconductor material is annealed by a scanning laser annealing.

6. The method of claim 1, wherein the ultra-thin high-quality semiconductor epilayer has a threading dislocation density of about $2 \times 10^4$ cm$^{-2}$ or less.

7. The method of claim 1, further comprising forming a second semiconductor material on the ultra-thin high-quality semiconductor epilayer, wherein the second semiconductor material comprises at least one element selected from the group consisting of Group II, Group III, Group IV, Group V, and Group VI.

8. The method of claim 1, wherein the initial ultra-thin semiconductor material is grown at a low temperature of about 350° C. or lower.

9. A method for forming a semiconductor layer comprising:
    growing an initial ultra-thin germanium film on a silicon substrate at a low temperature, wherein the crystallinity of the initial ultra-thin germanium film is about 30% or less;
    forming an insulator capping layer on the initial ultra-thin germanium film;
    annealing the insulator-capped initial ultra-thin germanium film to induce dislocation gliding to form pure edge dislocations at a Ge—Si heterojunction between the silicon substrate and the initial ultra-thin germanium film, and to form an insulator-capped ultra-thin high-quality germanium epitaxial film; and
    removing the insulator capping layer to expose the high-quality germanium epilayer on the silicon substrate.

10. The method of claim 9, wherein thermal annealing induces the dislocations to glide along <110> direction of the initial ultra-thin germanium film.

11. The method of claim 9, wherein formation of pure edge dislocations at the Ge—Si heterojunction occurs after annealing.

12. The method of claim 9, wherein the ultra-thin high-quality germanium epilayer has a threading dislocation density of about $2 \times 10^4$ cm$^{-2}$ or less.

13. The method of claim 9, wherein each of the initial ultra-thin germanium film and the ultra-thin high-quality germanium epitaxial film has a thickness of about 80 nm or less.

14. The method of claim 9, wherein each of the initial ultra-thin germanium film and the ultra-thin high-quality germanium epitaxial film is thicker than the Ge—Si interdiffusion length per given annealing step.

15. The method of claim 9, wherein the insulator capping layer comprises an optically transparent Si$_3$N$_4$ capping layer.

16. The method of claim 9, further comprising omitting a polishing process after the formation of the ultra-thin high-quality germanium epitaxial film.

17. The method of claim 9, further comprising forming a second semiconductor material on the ultra-thin high-quality germanium epitaxial film, wherein the second semiconductor material comprises at least one element chosen from Group II, Group III, Group IV, Group V, and Group VI.

18. A method for forming a semiconductor device according to claim 9, further comprising:
    growing a second initial ultra-thin germanium film at a low temperature on the ultra-thin high-quality germanium epitaxial film;
    forming a second insulator capping layer on the second initial ultra-thin germanium film;
    annealing the insulator capped second initial ultra-thin germanium film to form an insulator capped second ultra-thin high-quality germanium epitaxial film; and
    removing the second insulator capping layer and exposing a second ultrathin high-quality germanium epitaxial film.

19. The method of claim 14, wherein the Ge—Si interdiffusion length is about 7 nm or less.

20. A method for forming a semiconductor device comprising:
    providing a silicon substrate;
    forming one or more ultra-thin high-quality germanium epilayers on the silicon substrate, wherein each of the one or more ultra-thin high-quality germanium epilayers is formed by,
        capping a low-temperature grown initial ultra-thin germanium film by forming an insulator layer thereon,
        annealing the capped initial ultra-thin germanium film to induce dislocation gliding to form pure edge dislocations at a Ge—Si heterojunction between the silicon substrate and the initial ultra-thin germanium film, and to form a capped ultra-thin high-quality germanium epilayer, and
        removing the insulator layer, and
    forming a Group III-V material on the one or more ultra-thin high-quality germanium epilayers on the silicon substrate.

21. The method of claim 20, wherein the Group III-V material comprises a high-quality GaAs comprising single crystalline.

22. The method of claim 20, wherein each of the one or more ultra-thin high-quality germanium epilayers has a threading dislocation density of about $10^4$ cm$^{-2}$ or less.

23. A semiconductor device made by a process comprising:
    growing an initial ultra-thin semiconductor material on a lattice mismatched substrate at a low temperature, wherein the initial ultra-thin semiconductor material has a thickness of about 80 nm or less;
    forming an insulator capping layer on the initial ultra-thin semiconductor material;
    annealing the capped initial ultra-thin semiconductor material to induce dislocation gliding to form pure edge dislocations at a heterojunction between the lattice mismatched substrate and the initial ultra-thin semiconductor material, and to form a capped ultra-thin high-quality semiconductor epilayer; and
    removing the insulator capping layer to expose the high-quality semiconductor epilayer on the substrate.

24. A semiconductor device made by a process comprising:
    growing an initial ultra-thin germanium film on a silicon substrate at a low temperature, wherein the crystallinity of the initial ultra-thin germanium film is about 30% or less;
    forming an insulator capping layer on the initial ultra-thin germanium film;
    annealing the insulator-capped initial ultra-thin germanium film to induce dislocation gliding to form pure edge dislocations at a Ge—Si heterojunction between the silicon substrate and the initial ultra-thin germanium film, and to form an insulator-capped ultra-thin high-quality germanium epitaxial film; and removing the insulator capping layer to expose the high-quality germanium epilayer on the silicon substrate.

25. The semiconductor device of claim 24, the process further comprising:

growing a second initial ultra-thin germanium film at a low temperature on the ultra-thin high-quality germanium epitaxial film;

forming a second insulator capping layer on the second initial ultra-thin germanium film;

annealing the insulator capped second initial ultra-thin germanium film to form an insulator capped second ultra-thin high-quality germanium epitaxial film; and removing the second insulator capping layer and exposing a second ultrathin high-quality germanium epitaxial film.

* * * * *